(12) United States Patent
Annampedu (10) Patent No.: US 8,566,381 B2
(45) Date of Patent: Oct. 22, 2013

(54) SYSTEMS AND METHODS FOR SEQUENCE DETECTION IN DATA PROCESSING

(75) Inventor: Viswanath Annampedu, Schnecksville, PA (US)

(73) Assignee: LSI Corporation, San Jose, CA (US)

( * ) Notice: Subject to any disclaimer, the term of this patent is extended or adjusted under 35 U.S.C. 154(b) by 520 days.

(21) Appl. No.: 12/851,475

(22) Filed: Aug. 5, 2010

(65) Prior Publication Data

US 2012/0036173 A1 Feb. 9, 2012

(51) Int. Cl.
*G06F 17/15* (2006.01)

(52) U.S. Cl.
USPC .......................................................... 708/422

(58) Field of Classification Search
USPC ................................................ 708/420–426
See application file for complete search history.

(56) References Cited

U.S. PATENT DOCUMENTS

| | | |
|---|---|---|
| 3,973,182 A | 8/1976 | Kataoka |
| 3,973,183 A | 8/1976 | Kataoka |
| 4,024,571 A | 5/1977 | Dischert et al. |
| 4,777,544 A | 10/1988 | Brown et al. |
| 5,130,866 A | 7/1992 | Klaassen et al. |
| 5,237,325 A | 8/1993 | Klein et al. |
| 5,278,703 A | 1/1994 | Rub et al. |
| 5,309,357 A | 5/1994 | Stark et al. |
| 5,341,249 A | 8/1994 | Abbott et al. |
| 5,377,058 A | 12/1994 | Good et al. |
| 5,521,948 A | 5/1996 | Takeuchi |
| 5,523,902 A | 6/1996 | Pederson |
| 5,533,066 A * | 7/1996 | Yamaguchi et al. .......... 375/341 |
| 5,594,341 A | 1/1997 | Majidi-Ahy |
| 5,668,679 A | 9/1997 | Swearingen et al. |
| 5,696,639 A | 12/1997 | Spurbeck et al. |
| 5,781,129 A | 7/1998 | Schwartz et al. |
| 5,787,125 A | 7/1998 | Mittle |
| 5,798,885 A | 8/1998 | Saiki et al. |
| 5,835,295 A | 11/1998 | Behrens |
| 5,844,920 A | 12/1998 | Zook et al. |
| 5,852,524 A | 12/1998 | Glover et al. |
| 5,892,632 A | 4/1999 | Behrens |

(Continued)

FOREIGN PATENT DOCUMENTS

| | | |
|---|---|---|
| FR | 2904168 A1 | 1/2008 |
| WO | WO 03/047091 | 6/2003 |
| WO | WO 2008/009620 | 1/2008 |

OTHER PUBLICATIONS

U.S. Appl. No. 12/663,319, filed Dec. 7, 2009, Ratnakar Aravind.

(Continued)

*Primary Examiner* — Tan V. Mai
(74) *Attorney, Agent, or Firm* — Hamilton DeSanctis & Cha (57) ABSTRACT

Various embodiments of the present invention provide systems and methods for sequence detection. As an example, a method for data detection is disclosed that includes: receiving a series of data samples at a detector circuit; multiplying a portion of the series of data samples by a first correlator value corresponding to a first binary transition to yield a first value; multiplying the portion of the series of data samples by a second correlator value corresponding to a second binary transition to yield a second value; adding the first value to a prior state value to yield a first interim value; adding the second value to the prior state value to yield a second interim value; and selecting the larger of the first interim value and the second interim value to yield a surviving interim value.

19 Claims, 5 Drawing Sheets

(56) References Cited

U.S. PATENT DOCUMENTS

| | | |
|---|---|---|
| 5,955,783 A | 9/1999 | Ben-Efraim |
| 5,970,104 A | 10/1999 | Zhong et al. |
| 5,986,830 A | 11/1999 | Hein |
| 5,987,562 A | 11/1999 | Glover |
| 6,005,903 A * | 12/1999 | Mendelovicz ............... 708/422 |
| 6,009,549 A | 12/1999 | Bliss et al. |
| 6,023,383 A | 2/2000 | Glover et al. |
| 6,069,583 A | 5/2000 | Silvestrin et al. |
| 6,081,397 A | 6/2000 | Belser |
| 6,111,712 A | 8/2000 | Vishakhadatta et al. |
| 6,208,478 B1 | 3/2001 | Chiu et al. |
| 6,278,591 B1 | 8/2001 | Chang |
| 6,400,518 B1 | 6/2002 | Bhaumik et al. |
| 6,404,829 B1 | 6/2002 | Sonu |
| 6,411,452 B1 | 6/2002 | Cloke |
| 6,441,661 B1 | 8/2002 | Aoki et al. |
| 6,490,110 B2 | 12/2002 | Reed et al. |
| 6,493,162 B1 | 12/2002 | Fredrickson |
| 6,519,102 B1 | 2/2003 | Smith |
| 6,530,060 B1 | 3/2003 | Vis et al. |
| 6,603,622 B1 | 8/2003 | Christiansen et al. |
| 6,606,048 B1 | 8/2003 | Sutardja |
| 6,633,447 B2 | 10/2003 | Franck et al. |
| 6,646,822 B1 | 11/2003 | Tuttle et al. |
| 6,657,802 B1 | 12/2003 | Ashley et al. |
| 6,775,529 B1 | 8/2004 | Roo |
| 6,788,484 B2 | 9/2004 | Honma |
| 6,813,108 B2 | 11/2004 | Annampedu et al. |
| 6,816,328 B2 | 11/2004 | Rae |
| 6,839,014 B2 | 1/2005 | Uda |
| 6,856,183 B2 | 2/2005 | Annampedu |
| 6,876,511 B2 | 4/2005 | Koyanagi |
| 6,912,099 B2 | 6/2005 | Annampedu et al. |
| 6,963,521 B2 | 11/2005 | Hayashi |
| 6,999,257 B2 | 2/2006 | Takeo |
| 6,999,264 B2 | 2/2006 | Ehrlich |
| 7,002,761 B1 | 2/2006 | Sutardja et al. |
| 7,002,767 B2 | 2/2006 | Annampedu et al. |
| 7,038,875 B2 | 5/2006 | Lou et al. |
| 7,054,088 B2 | 5/2006 | Yamazake et al. |
| 7,072,137 B2 | 7/2006 | Chiba |
| 7,082,005 B2 | 7/2006 | Annampedu et al. |
| 7,092,462 B2 | 8/2006 | Annampedu et al. |
| 7,116,504 B1 | 10/2006 | Oberg |
| 7,126,776 B1 | 10/2006 | Warren, Jr. et al. |
| 7,136,250 B1 | 11/2006 | Wu et al. |
| 7,154,689 B1 | 12/2006 | Shepherd et al. |
| 7,167,328 B2 | 1/2007 | Annampedu et al. |
| 7,180,693 B2 | 2/2007 | Annampedu et al. |
| 7,187,739 B2 | 3/2007 | Ma |
| 7,191,382 B2 | 3/2007 | James et al. |
| 7,193,544 B1 | 3/2007 | Fitelson et al. |
| 7,193,798 B2 | 3/2007 | Byrd et al. |
| 7,199,961 B1 | 4/2007 | Wu et al. |
| 7,203,013 B1 | 4/2007 | Han et al. |
| 7,206,146 B2 | 4/2007 | Flynn et al. |
| 7,230,789 B1 | 6/2007 | Brunnett et al. |
| 7,248,425 B2 | 7/2007 | Byun et al. |
| 7,253,984 B1 | 8/2007 | Patapoutian et al. |
| 7,265,937 B1 | 9/2007 | Erden et al. |
| 7,301,717 B1 | 11/2007 | Lee et al. |
| 7,308,057 B1 | 12/2007 | Patapoutian |
| 7,323,916 B1 | 1/2008 | Sidiropoulos et al. |
| 7,362,536 B1 | 4/2008 | Liu et al. |
| 7,375,918 B1 | 5/2008 | Shepherd et al. |
| 7,411,531 B2 | 8/2008 | Aziz et al. |
| 7,420,498 B2 | 9/2008 | Barrenscheen |
| 7,423,827 B2 | 9/2008 | Neville et al. |
| 7,446,690 B2 | 11/2008 | Kao |
| 7,499,238 B2 | 3/2009 | Annampedu |
| 7,525,460 B1 | 4/2009 | Liu et al. |
| 7,602,568 B1 | 10/2009 | Katchmart |
| 7,620,101 B1 | 11/2009 | Jenkins |
| 7,630,155 B2 | 12/2009 | Maruyama et al. |
| 2002/0001151 A1 | 1/2002 | Lake |
| 2002/0150179 A1 | 10/2002 | Leis et al. |
| 2002/0176185 A1 | 11/2002 | Fayeulle et al. |
| 2002/0181377 A1 | 12/2002 | Nagata et al. |
| 2003/0095350 A1 | 5/2003 | Annampedu et al. |
| 2004/0179460 A1 | 9/2004 | Furumiya et al. |
| 2005/0046982 A1 | 3/2005 | Liu et al. |
| 2005/0157415 A1 | 7/2005 | Chiang |
| 2005/0243455 A1 | 11/2005 | Annampedu |
| 2007/0064847 A1 | 3/2007 | Gaedke |
| 2007/0071152 A1 | 3/2007 | Chen et al. |
| 2007/0103805 A1 | 5/2007 | Hayashi |
| 2007/0104300 A1 | 5/2007 | Esumi et al. |
| 2007/0183073 A1 | 8/2007 | Sutardja et al. |
| 2007/0230015 A1 | 10/2007 | Yamashita |
| 2007/0263311 A1 | 11/2007 | Smith |
| 2008/0056403 A1 | 3/2008 | Wilson |
| 2008/0080082 A1 | 4/2008 | Erden et al. |
| 2008/0212715 A1 | 9/2008 | Chang |
| 2008/0266693 A1 | 10/2008 | Bliss et al. |
| 2009/0002862 A1 | 1/2009 | Park |
| 2009/0142620 A1 | 6/2009 | Yamamoto et al. |
| 2009/0245448 A1 | 10/2009 | Ran et al. |
| 2009/0274247 A1 | 11/2009 | Galbraith et al. |

OTHER PUBLICATIONS

U.S. Appl. No. 12/887,327, filed Sep. 21, 2010, Llu et al.
U.S. Appl. No. 12/894,221, filed Sep. 30, 2010, Yang et al.
U.S. Appl. No. 12/946,048, filed Nov. 15, 2010, Yang et al.
U.S. Appl. No. 12/947,962, filed Nov. 17, 2010, Liu et al.
U.S. Appl. No. 12/946,033, filed Nov. 15, 2010, Yang et al.
U.S. Appl. No. 12/955,789, filed Nov. 29, 2010, Annampedu et al.
U.S. Appl. No. 12/955,821, filed Nov. 29, 2010, Annampedu et al.
Annampedu and Aziz, "Adaptive Algorithms for Asynchronous Detection of Coded Servo Signals Based on Interpolation", IEEE Transactions on Magnetics, vol. 41, No. 10, Oct. 20, 2005.
Aziz, Annampedu, "Interpolation Based Max.-Likelihood(ML) Detection Asynchronous Servo Repeatable Run Out Data", Digest, IEEE Int'l Mag. Conf. vol. 42 No. 10 pp. 2585-2587 Oct. 2006.

* cited by examiner

SYSTEMS AND METHODS FOR SEQUENCE DETECTION IN DATA PROCESSING

BACKGROUND OF THE INVENTION

The present inventions are related to systems and methods for processing data, and more particularly to systems and methods for detecting data sequences.

A typical data processing system receives an analog input signal that is sampled to yield a series of digital samples. The data often includes sequences of data used for data synchronization and/or other purposes. Various existing data processing systems utilize, for example, a Viterbi sequence detection circuit. Such a circuit operates well where the received digital samples of the analog input signal are accurately equalized to a target response and accurate timing and gain control are applied. In some cases, sufficient accuracy is hard to achieve resulting in degraded performance of the sequence detection. Other approaches rely on threshold detection processes that work reasonably well in low noise environments, but as channel bit densities increase the effects of noise increase rendering such threshold approaches less effective.

Hence, for at least the aforementioned reasons, there exists a need in the art for advanced systems and methods for data sequence detection.

BRIEF SUMMARY OF THE INVENTION

The present inventions are related to systems and methods for processing data, and more particularly to systems and methods for detecting data sequences.

Various embodiments of the present invention provide methods for data detection that include receiving a series of data samples at a detector circuit; multiplying a portion of the series of data samples by a first correlator value corresponding to a first binary transition to yield a first value; multiplying the portion of the series of data samples by a second correlator value corresponding to a second binary transition to yield a second value; adding the first value to a prior state value to yield a first interim value; adding the second value to the prior state value to yield a second interim value; and selecting the larger of the first interim value and the second interim value to yield a surviving interim value. In some cases, the methods further include storing the surviving interim value as the prior state value.

In various instances of the aforementioned embodiments, the surviving interim value is a first surviving interim value and the prior state is a first prior state. In such instances, the methods further include multiplying the portion of the series of data samples by a third correlator value corresponding to a third binary transition to yield a third value; multiplying the portion of the series of data samples by a fourth correlator value corresponding to a fourth binary transition to yield a fourth value; adding the third value to a second prior state value to yield a third interim value; adding the fourth value to the second prior state value to yield a fourth interim value; and selecting the larger of the third interim value and the fourth interim value to yield a second surviving interim value. In some instances of the aforementioned embodiments, the methods further include storing the second surviving interim value as the second prior state value.

In various instances of the aforementioned embodiments, the methods further include selecting the larger of the first surviving interim value and the second surviving interim value to yield a surviving state value where the surviving state value is associated with a surviving state. In such cases, the surviving state is selected as the most recent bit in a bit sequence. In some cases, the methods further include selecting a prior state corresponding to one of the first prior state value and the second prior state value that was used in calculating the selected one of the first surviving interim value and the second surviving interim value as the bit preceding the most recent bit in the bit sequence.

In one or more instances of the aforementioned embodiments, the first prior state value corresponds to a zero state, and the second prior state value corresponds to a one state. In some cases, the first binary state is a one state to a zero state transition, the second binary state is a zero state to a zero state transition, the third binary transition is a zero state to a one state transition, and the fourth binary transition is a one state to a one state transition. In one particular case, the first correlator value is an array 1, 0, −1, −1; the second correlator value is an array 0, 1, 0, −1; the third correlator value is an array −1, 0, 1, 1; and the fourth correlator value is an array 0, −1, 0, 1.

Other embodiments of the present invention provide sequence detector circuits that include a first, second, third and fourth multiplier circuits, a first, second, third and fourth adder circuits, and a first and second selector circuit. The first multiplier circuit is operable to multiply a series of digital samples by a first correlator value corresponding to a one state to a one state transition to yield a first value. The second multiplier circuit is operable to multiply the series of digital samples by a second correlator value corresponding to a zero state to a one state transition to yield a second value. The third multiplier circuit is operable to multiply the series of digital samples by a third correlator value corresponding to a one state to a zero state transition to yield a third value. The fourth multiplier circuit is operable to multiply the series of digital samples by a fourth correlator value corresponding to a zero state to a zero state transition to yield a fourth value. The first adder circuit is operable to sum the first value and a prior one state value to yield a first interim state value. The second adder circuit is operable to sum the second value and the prior one state value to yield a second interim state value. The third adder circuit is operable to sum the third value and a prior zero state value to yield a third interim state value. The fourth adder circuit is operable to sum the fourth value and the prior zero state value to yield a fourth interim state value. The first selector circuit operable to select the larger of the first interim state value and the second interim state value to yield a first surviving interim state value, and the second selector circuit operable to select the larger of the third interim state value and the fourth interim state value to yield a second surviving interim state value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for processing data, and more particularly to systems and methods for detecting data sequences.

Figure 1:
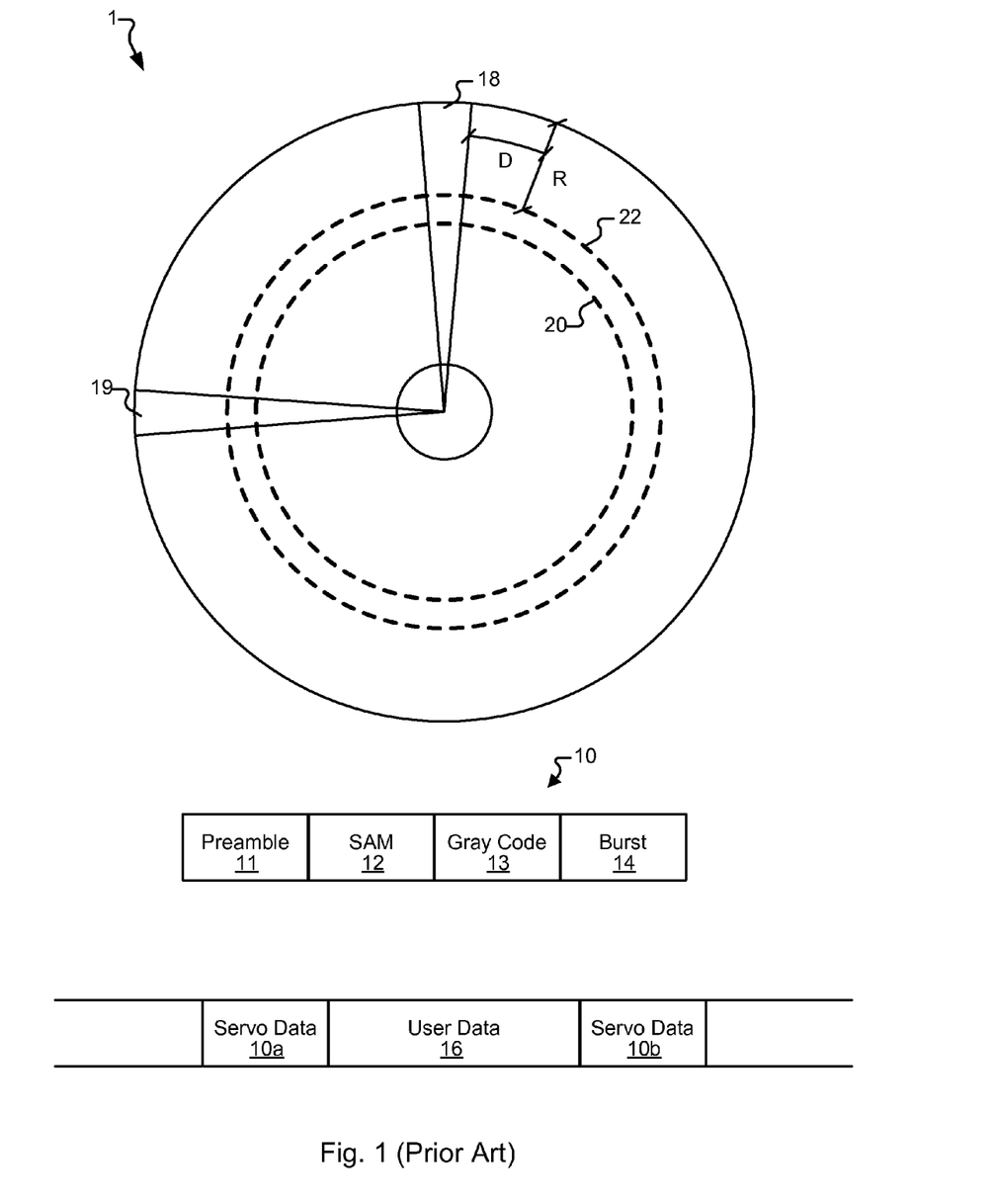
FIG. 1 is a block diagram of a known magnetic storage medium and sector data scheme.

Turning to FIG. 1, a storage medium 1 is shown with two exemplary tracks 20, 22 indicated as dashed lines. The tracks are segregated by servo data written within wedges 19, 18. These wedges include servo data 10 that are used for control and synchronization of a read/write head assembly over a desired location on storage medium 1. In particular, this servo data generally includes a preamble pattern 11 followed by a servo address mark 12 (SAM). Servo address mark 12 is followed by a Gray code 13, and Gray code 13 is followed by burst information 14. It should be noted that while two tracks and two wedges are shown, hundreds of each would typically be included on a given storage medium. Further, it should be noted that a servo data set may have two or more fields of burst information. Yet further, it should be noted that different information may be included in the servo fields such as, for example, repeatable run-out information that may appear after burst information 14. Between the servo data bit patterns 10a and 10b, a user data region 16 is provided.

In operation, storage medium 1 is rotated in relation to a sensor that senses information from the storage medium. In a read operation, the sensor would sense servo data from wedge 19 (i.e., during a servo data period) followed by user data from a user data region between wedge 19 and wedge 18 (i.e., during a user data period) and then servo data from wedge 18. In a write operation, the sensor would sense servo data from wedge 19 then write data to the user data region between wedge 19 and wedge 18. Then, the sensor would be switched to sense a remaining portion of the user data region followed by the servo data from wedge 18.

Various embodiments of the present invention provide systems and methods for sequence detection that rely on a rough equalization to a target response followed by data dependent match filtering correlated to received digital samples. Using this information, a data path traversing a sequence can be determined that maximizes the output of the data dependent match filtering to yield a most likely data sequence. Unlike a standard Viterbi sequence detector that has a channel memory representing N−1 number of states, where N is the length of the partial response, one or more embodiments of the present invention utilize two distinct states for detecting binary data. Such systems and methods provide for a variety of advantages that may be had in different embodiments of the present invention. For example, in some cases, less precise equalization, timing and gain control than that required by a standard Viterbi detection process may be allowable. Where this is the case, increased manufacturing efficiency of products relying on data detection circuits may be achieved due to a reduction in the amount of time allotted to equalization testing. As another example, in some cases, enhanced noise immunity may be achieved when compared with threshold based sequence detection systems. Based upon the disclosure provided herein, one of ordinary skill in the art will recognize a variety of other advantages achievable through implementations of different embodiments of the present invention that may be achieved alternatively to or in addition to the advantages described above, Turning to FIG. 2, a data sequence detector circuit 100 is shown in accordance with one or more embodiments of the present invention. Data sequence detector circuit 100 includes an analog to digital converter circuit 110 that receives an analog input signal 105, and provides a series of digital samples 115 representing analog input signal 105. Digital samples 115 are synchronized to a 4T sample clock 107. Analog to digital converter circuit 110 may be any circuit or system known in the art that is capable of converting a continuous signal into a series of digital samples. Analog input signal 105 is a continuous signal representing a number of bit periods. The bit periods recur with a periodicity of T, and the 4T sample clock causes analog to digital converter circuit 110 to generate four samples of analog input signal 105 for each period T. It should be noted that while the present embodiment is described as utilizing four samples per period, that other embodiments of the present invention may use a lower sampling frequency such as, for example, a 2T clock, or may use a higher sampling frequency such as, for example, an 8T clock or 16T clock. Based upon the disclosure provided herein, one of ordinary skill in the art will recognize a variety of sampling frequencies and corresponding bit periods that may be used in relation to different embodiments of the present invention. Analog input signal 105 may be derived from a variety of sources. For example, analog input signal may be received from a read/write head assembly disposed in relation to a storage medium. As another example, analog input signal may be derived from a receiver circuit that is receiving a wireless transmission. Based upon the disclosure provided herein, one of ordinary skill in the art will recognize a variety of other sources of analog input signal 105.

Figure 2:
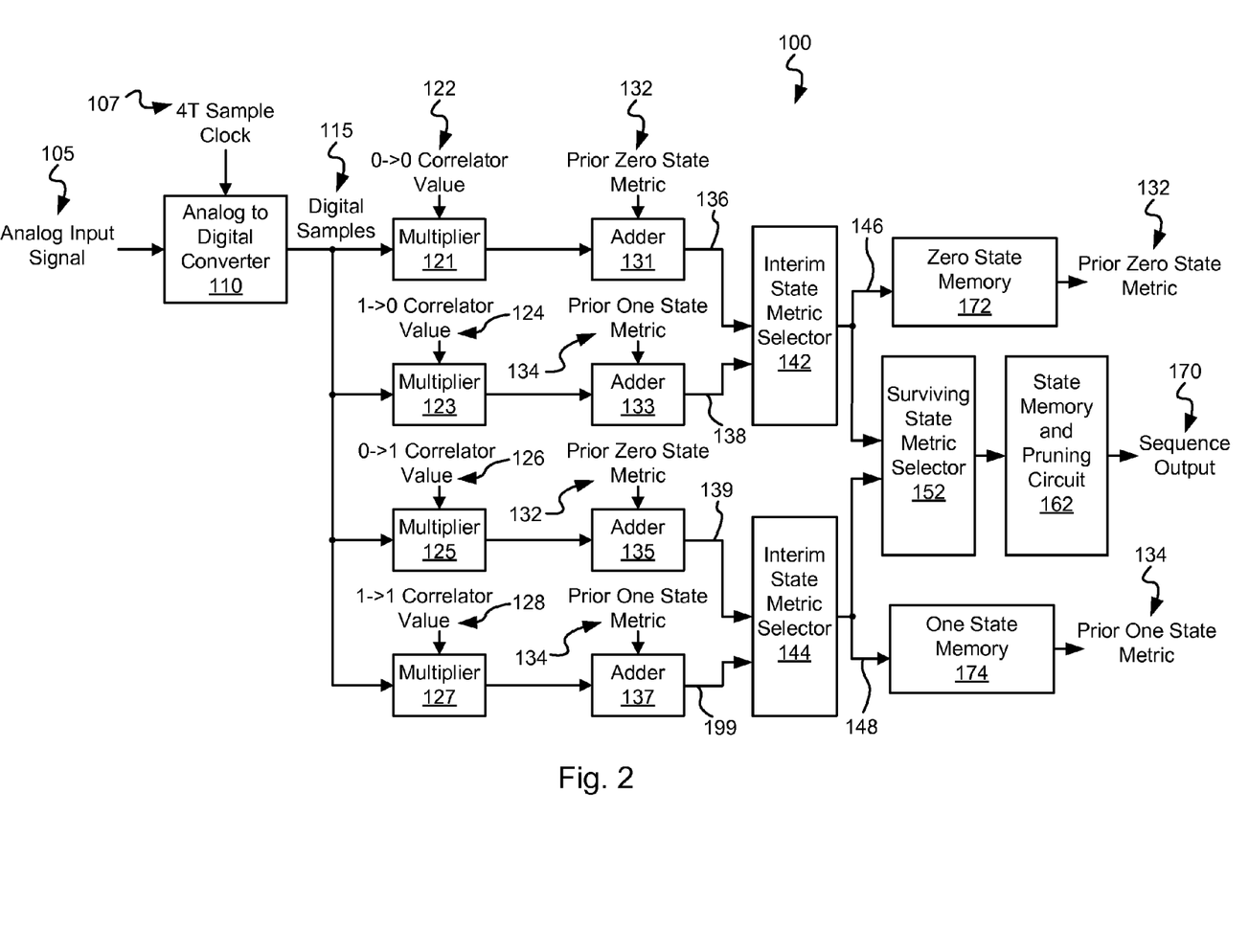
FIG. 2 depicts a data sequence detector circuit in accordance with one or more embodiments of the present invention.

Digital samples 115 are provided in parallel to a block of multiplier circuits that each multiply the received digital sample by an array representing a particular transition path. In this case where there are two possible next states from any given prior state, four multiplier circuits are used. In particular, a multiplier circuit 121 multiplies digital samples 115 by a correlator value 122 representing a transition from a prior zero state to a next zero state. A multiplier circuit 123 multiplies digital samples 115 by a correlator value 124 representing a transition from a prior one state to a next zero state. A multiplier circuit 125 multiplies digital samples 115 by a correlator value 126 representing a transition from a prior zero state to a next one state. A multiplier circuit 127 multiplies digital samples 115 by a correlator value 128 representing a transition from a prior one state to a next one state. The resulting products from multiplier circuits 121, 123, 125, 127 are provided to respective adder circuits.

An adder circuit 131 performs a signed sum the product from multiplier circuit 121 with a prior zero state metric 132 to yield a sum 136, and an adder circuit 135 performs a signed sum the product from multiplier circuit 125 with the same prior zero state metric 132 to yield a sum 139. An adder circuit 133 performs a signed sum the product from multiplier circuit 123 with a prior one state metric 134 to yield a sum 138, and an adder circuit 137 performs a signed sum the product from multiplier circuit 127 with the same prior one state metric 134 to yield a sum 199. Prior zero state metric 132 is the value calculated for the next zero state during processing of the preceding four samples of digital samples 115 and is available from a zero state memory 172. Similarly, prior one state metric 134 is the value calculated for the next one state during processing of the preceding four samples of digital samples 115 and is available from a one state memory 174.

An interim state metric selector circuit 142 determines which of sum 136 and sum 138 is larger and provides the larger value as an interim output 146. Similarly, an interim state metric selector circuit 144 determines which of sum 139 and sum 199 is larger and provides the larger value as an interim output 148. Interim output 146 is provided to zero state memory 172 where it is stored and maintained as prior zero state metric 132 for use in processing the next four samples of digital samples 115. Interim output 148 is provided to one state memory 174 where it is stored and maintained as prior one state metric 134 for use in processing the next four samples of digital samples 115.

Both interim output 146 and interim output 148 are provided to a surviving state metric selector circuit 152 that selects the larger of interim value 146 and interim value 148 as the value of the surviving state. The state corresponding to the larger value is the surviving state, and an indication of the surviving state is passed to a state memory and pruning circuit 162. State memory and pruning circuit 162 determines a state to state path extending backward from the identified surviving state and resulting in the value selected by surviving state metric selector circuit 152. In doing so, state memory and pruning circuit 162 relies on previously calculated and stored sum values (i.e., sum 136, 138, 139, 199) and prior multiplication products (i.e., products from multipliers 121, 123, 125, 127) for prior periods T.

In operation, analog input signal 105 is provided to analog to digital converter 110. Analog input signal 105 represents a number of digital data bits. In some cases, the data represented by analog input signal was wide bi phase encoded prior to writing to a storage medium or transfer via a transmission system. In such an encoding, a logic zero is represented by the following series of digital samples '1100', and a logic one is represented by the following series of digital samples '0011'. As an example, the bit sequence '1 0 0 1 1' is encoded as '0011110011000011 0011' prior to conversion to the analog signal domain where each bit of the '1 0 0 1 1' bit pattern corresponds to a 1T period and each of the encoded bit values corresponds to a period 1T/4.

Where a target of [5 5 −5 −5] is used, when the analog signal is retrieved from the storage medium or a transfer medium the preceding example would ideally result in the following digital samples 115 '20 10 0 −10 −20 0 20 0 −20 −10 0 10 20 0 −20 0 20'. As can be seen, in a transition from a logic one to a logic zero digital samples 115 transition from 20 to 10 to 0 to −10. In this case, where a correlator circuit (e.g., multiplier 123) is used that multiplies the samples '10 0 −10 −20' by an array [1 0 −1 −1] (i.e., 1→0 correlator value 124) yielding an output value of +40 (i.e., [1*10]+[0*0]+[−1*−10]+[−1*−20]=40). Similarly, in a transition from a logic zero to a logic zero an array (i.e., 0→0 correlator value 122) [0 1 0 −1] is used by a correlator circuit (i.e., multiplier 121). In a transition from a logic zero to a logic one an array (i.e., 0→1 correlator value 126) [−1 0 1 1] is used by a correlator circuit (i.e., multiplier 125). Finally, in a transition from a logic one to a logic one an array (i.e., 1→1 correlator value 128) [0 −1 0 1] is used by a correlator circuit (i.e., multiplier 127). It should be noted that other encoding approaches and/or correlator values may be used in relation to different embodiments of the present invention.

Noise and timing errors result in something other than ideal sample values being provided as digital samples 115 from analog to digital converter 110. As an example, assume the following digital samples 115 are received synchronous to 4T sample clock 107:

[ . . . 124] [51, −35, −102, −112] [−16, 28, 48, 13] [−76, −42, 70, 52] [42, 56, −12, 99].

In the preceding series of samples, blocks of four samples are grouped with the final sample in each group being the sample that would have been used as the single sample where a simple threshold detector circuit had been used in place of data sequence detector circuit 100. Of note, where such a simple threshold detection approach is employed, digital samples 115 '124, −112, 13, 52, 99' would yield a detected sequence of '1 0 1 1 1'. As is shown below, data sequence detector circuit 100 yields the correct sequence of '1 0 0 1 1' as it is not as susceptible to noise as a simple threshold detector circuit.

Figure 4A:
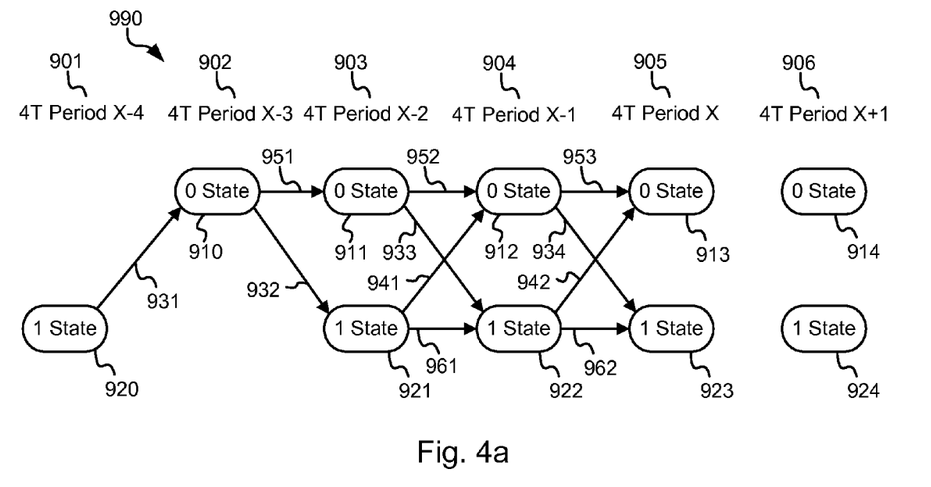
FIGS. 4a-4c depict an example state transition map corresponding to the processes described in the flow diagram of FIG. 3 and/or the circuit depicted in FIG. 2.

Using the aforementioned series of digital samples 115 and referring to a trellis diagram 990 of FIG. 4a, an example operation of data sequence detector circuit 100 is further described. Assume that for a bit period 901 (4T period X-4), the one state is the surviving state (i.e., 1 state 920) as selected by state metric selector circuit 152 with a state value of '124'; and for a bit period 902 (4T period X-3), the zero state is the surviving state (i.e., 0 state 910) as selected by state metric selector circuit 152 with a state value of '389', and sum 138 corresponding to a one to zero transition path 931 having a value of '265'. The value '265' is derived by a preceding multiplication by multiplier 123 of 1→0 correlator value 124 (i.e., [1 0 −1 −1]) by digital samples '51, −35, −102, −112' as follows:

Value of Path 931=(1*51)+(0*−35)+(−1*−102)+(−1*−112)=265.

The value of path 931 (i.e., '265') is added to the value of 1 state 920 (i.e., '124') to yield the value of 0 state 910 of '389'. Of note, for a bit period 903 (4T period X-2), the end state of the detected sequence is 1 state 921.

From 0 state 910 two possible paths are shown: a zero to one transition path 932, and a zero to zero transition path 951. The value of zero to one transition path 932 is calculated where multiplier 125 multiplies the next series of four samples (i.e., '−16, 28, 48, 13') by 0→1 correlator value 126 (i.e., [−1 0 1 1]) as follows:

Value of Path 932=(−1*−16)+(0*28)+(1*48)+(1*13)=77.

Similarly, the value of zero to zero transition path 951 is calculated where multiplier 121 multiplies the next series of four samples (i.e., '−16, 28, 48, 13') by 0→0 correlator value 122 (i.e., [0 1 0 −1]) as follows:

Value of Path 951=(0*−16)+(1*28)+(0*48)+(−1*13)=15.

Adder 135 adds the value of path 931 derived from multiplier 125 to the value of the prior zero state (i.e., the value of 0 state 910 which in this example is '389') to yield sum 139 in accordance with the following equation:

Sum 139=389+77=466.

Adder 131 adds the value of path 951 derived from multiplier 121 to the value of the prior zero state (i.e., the value of 0 state 910 which in this example is '389') to yield sum 136 in accordance with the following equation:

Sum 136=389+15=404.

At this juncture sufficient historical data has been developed to finish describing the operation of data sequence detector circuit 100 where the historical data is stored to state memory and pruning circuit 162 allowing for tracing a path back through the state options represented by trellis diagram 990 to determine the detected sequence of data bits.

The next series of four instances of data samples 115 are received as '−76, −42, 70, 52'. These data samples are multiplied by respective correlator values to yield path values for the transitions from zero to zero, from zero to one, from one to zero, and from one to one. In particular, the received data samples are provided to multiplier 121 where they are multiplied by 0→0 correlator value 122 [0 1 0 −1] to yield a path value 952 in accordance with the following equation:

Value of Path 952=(0*−76)+(1*−42)+(0*70)+(−1*52)
=−94.

The received data samples are also provided to multiplier 123 where they are multiplied by 1→0 correlator value 124 [1 0 −1 −1] to yield a path value 941 in accordance with the following equation:

Value of Path
941=(1*−76)+(0*−42)+(−1*70)+(−1*52)=−198.

The received data samples are also provided to multiplier 125 where they are multiplied by 0→1 correlator value 126 [−1 0 1 1] to yield a path value 933 in accordance with the following equation:

Value of Path 933=(−1*−76)+(0*−42)+(1*70)+(1*52)
=198.

In addition, the received data samples are provided to multiplier 127 where they are multiplied by 1→1 correlator value 128 [0 −1 0 1] to yield a path value 961 in accordance with the following equation:

Value of Path 961=(0*−76)+(−1*−42)+(0*70)+(1*52)
=94.

The previously calculated path values are added to the state from which the respective begins to yield corresponding sums. In particular, path value 952 is provided to adder 131 where it is added to prior zero state metric 132 (i.e., the value of 0 state 911 which in this example is '404') to yield sum 136 in accordance with the following equation:

Sum 136=404−94=310.

Path value 941 is provided to adder 133 where it is added to prior one state metric 134 (i.e., the value of 1 state 921 which in this example is '466') to yield sum 138 in accordance with the following equation:

Sum 138=466−198=268.

Path value 933 is provided to adder 135 where it is added to prior zero state metric 132 (i.e., the value of 0 state 911 which in this example is '404') to yield sum 139 in accordance with the following equation:

Sum 139=404+198=602.

Path value 961 is provided to adder 137 where it is added to prior one state metric 134 (i.e., the value of 1 state 921 which in this example is '466') to yield sum 199 in accordance with the following equation:

Sum 199=466+94=560.

Interim state metric selector circuit 142 selects the greater of sum 136 and sum 138 and causes the selected value to be written to zero state memory 172. Zero state memory 172 outputs the stored value as prior zero state metric 132. In this case, sum 136 is selected over sum 138, and the larger value (i.e., 310) is provided as interim output 146 to surviving state metric selector circuit 152. Similarly, interim state metric selector circuit 144 selects the greater of sum 139 and sum 199 and causes the selected value to be written to one state memory 174. One state memory 174 outputs the stored value as prior one state metric 134. In this case, sum 139 is selected over sum 199, and the larger value (i.e., 602) is provided as interim output 148 to surviving state metric selector circuit 152. In turn, surviving state metric selector circuit 152 selects the larger of interim output 146 and interim output 148. In this case, the surviving state is selected as 1 state 922 as it is associated with the largest interim output, '602'. Thus, for a bit period 904 (4T period X-1), the end state of the detected sequence is 1 state 922.

The selection of 1 state 922 is provided to state memory and pruning circuit 162. In turn, state memory and pruning circuit 162 traces the states that were traversed to result in selected 1 state 922. In this case, the following sequence of states were traversed to yield 1 state 922:

Sequence Output 170=[1 state 920, 0 state 910, 0 state 911, 1 state 922]='1 0 0 1'.

It should be noted that sequence output 170 may include more or fewer than the example four bits depending upon the number of bits in an expected sequence. A longer sequence may include the storage of more interim path and state values by state memory and pruning circuit 162. In contrast, a shorter sequence may utilize the storage of fewer interim path and state values by state memory and pruning circuit 162. Where only a four bit sequence is detected, memory storing the value of 1 state 920 is removed along with corresponding information is removed (i.e., pruned) from state memory and pruning circuit 162.

The next series of samples are received as digital samples 115. In this example, the next four samples are '42, 56, −12, 99'. These data samples are multiplied by respective correlator values to yield path values for the transitions from zero to zero, from zero to one, from one to zero, and from one to one. In particular, the received data samples are provided to multiplier 121 where they are multiplied by 0→0 correlator value 122 [0 1 0 −1] to yield a path value 953 in accordance with the following equation:

Value of Path 953=(0*42)+(1*56)+(0*−12)+(−1*99)
=−43.

The received data samples are also provided to multiplier 123 where they are multiplied by 1→0 correlator value 124 [1 0 −1 −1] to yield a path value 942 in accordance with the following equation:

Value of Path 942=(1*42)+(0*56)+(−1*−12)+(−1*99)
=−45.

The received data samples are also provided to multiplier 125 where they are multiplied by 0→1 correlator value 126 [−1 0 1 1] to yield a path value 934 in accordance with the following equation:

Value of Path 934=(−1*42)+(0*56)+(1*−12)+(1*99)
=45.

In addition, the received data samples are provided to multiplier 127 where they are multiplied by 1→1 correlator value 128 [0 −1 0 1] to yield a path value 962 in accordance with the following equation:

Value of Path 962=(0*42)+(−1*56)+(0*−12)+(1*99)
=43.

The previously calculated path values are added to the state from which the respective begins to yield corresponding sums. In particular, path value 953 is provided to adder 131 where it is added to prior zero state metric 132 (i.e., the value of 0 state 912 which in this example is '310') to yield sum 136 in accordance with the following equation:

Sum 136=310−43=267.

Path value 942 is provided to adder 133 where it is added to prior one state metric 134 (i.e., the value of 1 state 922 which in this example is '602') to yield sum 138 in accordance with the following equation:

Sum 138=602−45=557.

Path value 934 is provided to adder 135 where it is added to prior zero state metric 132 (i.e., the value of 0 state 912 which in this example is '310') to yield sum 139 in accordance with the following equation:

Sum 139=310+45=355.

Path value 962 is provided to adder 137 where it is added to prior one state metric 134 (i.e., the value of 1 state 922 which in this example is '602') to yield sum 199 in accordance with the following equation:

Sum 199=602+43=645.

Interim state metric selector circuit 142 selects the greater of sum 136 and sum 138 and causes the selected value to be written to zero state memory 172. Zero state memory 172 outputs the stored value as prior zero state metric 132. In this case, sum 138 is selected over sum 136, and the larger value (i.e., 557) is provided as interim output 146 to surviving state metric selector circuit 152. Similarly, interim state metric selector circuit 144 selects the greater of sum 139 and sum 199 and causes the selected value to be written to one state memory 174. One state memory 174 outputs the stored value as prior one state metric 134. In this case, sum 199 is selected over sum 139, and the larger value (i.e., 645) is provided as interim output 148 to surviving state metric selector circuit 152. In turn, surviving state metric selector circuit 152 selects the larger of interim output 146 and interim output 148. In this case, the surviving state is selected as 1 state 923 as it is associated with the largest interim output, '645'. Thus, for a bit period 905 (4T period X), the end state of the detected sequence is 1 state 923.

The selection of 1 state 923 is provided to state memory and pruning circuit 162. In turn, state memory and pruning circuit 162 traces the states that were traversed to result in selected 1 state 923. In this case, the following sequence of states were traversed to yield 1 state 923:

Sequence Output 170=[0 state 910, 0 state 911, 1 state 922, 1 state 923]='0 0 1 1'.

Figure 4B:
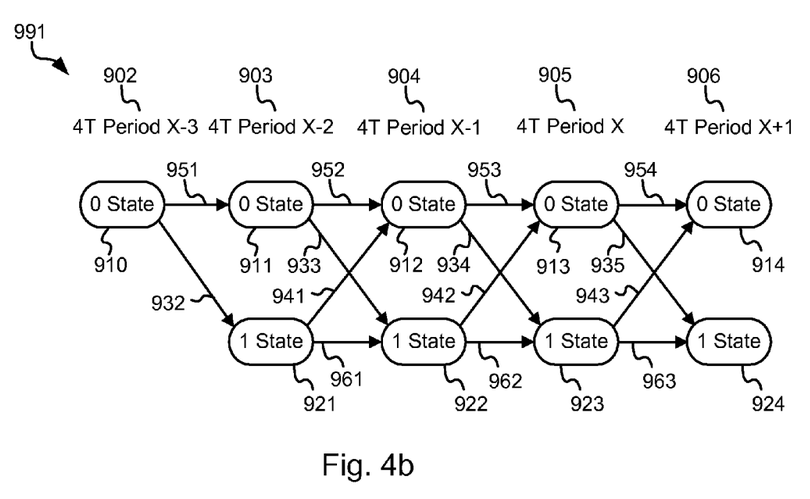

Again, where only a four bit sequence is detected, memory storing the value of 0 state 910 and the value of paths extending from 0 state 910 are removed (i.e., pruned) from state memory and pruning circuit 162 as shown in a trellis diagram 991 of FIG. 4b.

Turning to FIG. 4b, the next series of samples are received as digital samples 115. In this example, assume the next four samples are '−34, 1, 14, 64'. These data samples are multiplied by respective correlator values to yield path values for the transitions from zero to zero, from zero to one, from one to zero, and from one to one. In particular, the received data samples are provided to multiplier 121 where they are multiplied by 0→0 correlator value 122 [0 1 0 −1] to yield a path value 954 in accordance with the following equation:

Value of Path 954=(0*−34)+(1*1)+(0*14)+(−1*64)=−63.

The received data samples are also provided to multiplier 123 where they are multiplied by 1→0 correlator value 124 [1 0 −1 −1] to yield a path value 943 in accordance with the following equation:

Value of Path 943=(1*−34)+(0*1)+(−1*14)+(−1*64)=−112.

The received data samples are also provided to multiplier 125 where they are multiplied by 0→1 correlator value 126 [−1 0 1 1] to yield a path value 935 in accordance with the following equation:

Value of Path 935=(−1*−34)+(0*1)+(1*14)+(1*64)=112.

In addition, the received data samples are provided to multiplier 127 where they are multiplied by 1→1 correlator value 128 [0 −1 0 1] to yield a path value 963 in accordance with the following equation:

Value of Path 963=(0*−34)+(−1*1)+(0*14)+(1*64)=63.

The previously calculated path values are added to the state from which the respective begins to yield corresponding sums. In particular, path value 954 is provided to adder 131 where it is added to prior zero state metric 132 (i.e., the value of 0 state 913 which in this example is '355') to yield sum 136 in accordance with the following equation:

Sum 136=355−63=292.

Path value 943 is provided to adder 133 where it is added to prior one state metric 134 (i.e., the value of 1 state 923 which in this example is '645') to yield sum 138 in accordance with the following equation:

Sum 138=645−112=533.

Path value 935 is provided to adder 135 where it is added to prior zero state metric 132 (i.e., the value of 0 state 913 which in this example is '355') to yield sum 139 in accordance with the following equation:

Sum 139=355+63=418.

Path value 963 is provided to adder 137 where it is added to prior one state metric 134 (i.e., the value of 1 state 923 which in this example is '645') to yield sum 199 in accordance with the following equation:

Sum 199=645+112=757.

Interim state metric selector circuit 142 selects the greater of sum 136 and sum 138 and causes the selected value to be written to zero state memory 172. Zero state memory 172 outputs the stored value as prior zero state metric 132. In this case, sum 138 is selected over sum 136, and the larger value (i.e., 533) is provided as interim output 146 to surviving state metric selector circuit 152. Similarly, interim state metric selector circuit 144 selects the greater of sum 139 and sum 199 and causes the selected value to be written to one state memory 174. One state memory 174 outputs the stored value as prior one state metric 134. In this case, sum 199 is selected over sum 139, and the larger value (i.e., 757) is provided as interim output 148 to surviving state metric selector circuit 152. In turn, surviving state metric selector circuit 152 selects the larger of interim output 146 and interim output 148. In this case, the surviving state is selected as 1 state 924 as it is associated with the largest interim output, '757'. Thus, for a bit period 906 (4T period X+1), the end state of the detected sequence is 1 state 924.

The selection of 1 state 924 is provided to state memory and pruning circuit 162. In turn, state memory and pruning circuit 162 traces the states that were traversed to result in selected 1 state 924. In this case, the following sequence of states were traversed to yield 1 state 924:

Sequence Output 170=[0 state 911, 1 state 922, 1 state 923. 1 state 924]='0 1 1 1'.

Figure 4C:
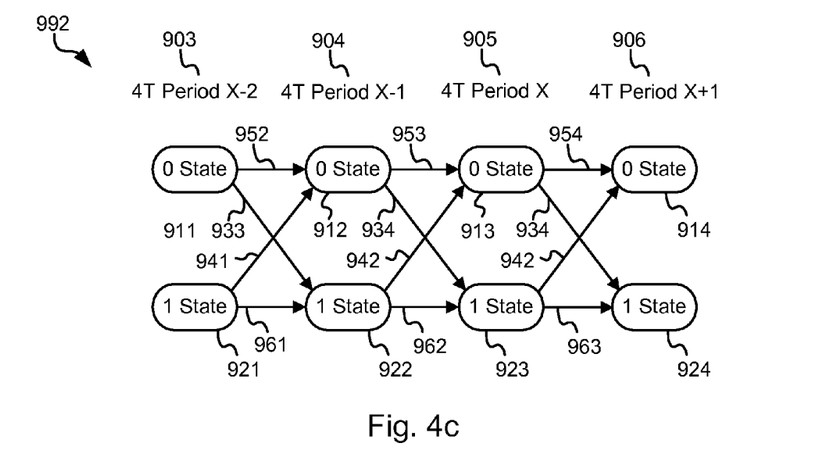

Again, where only a four bit sequence is detected, memory storing the value of 0 state 911 and the value of paths extending from 0 state 911 are removed (i.e., pruned) from state memory and pruning circuit 162 as shown in a trellis diagram 992 FIG. 4c. This process continues as additional series of data bits are received.

Figure 3:
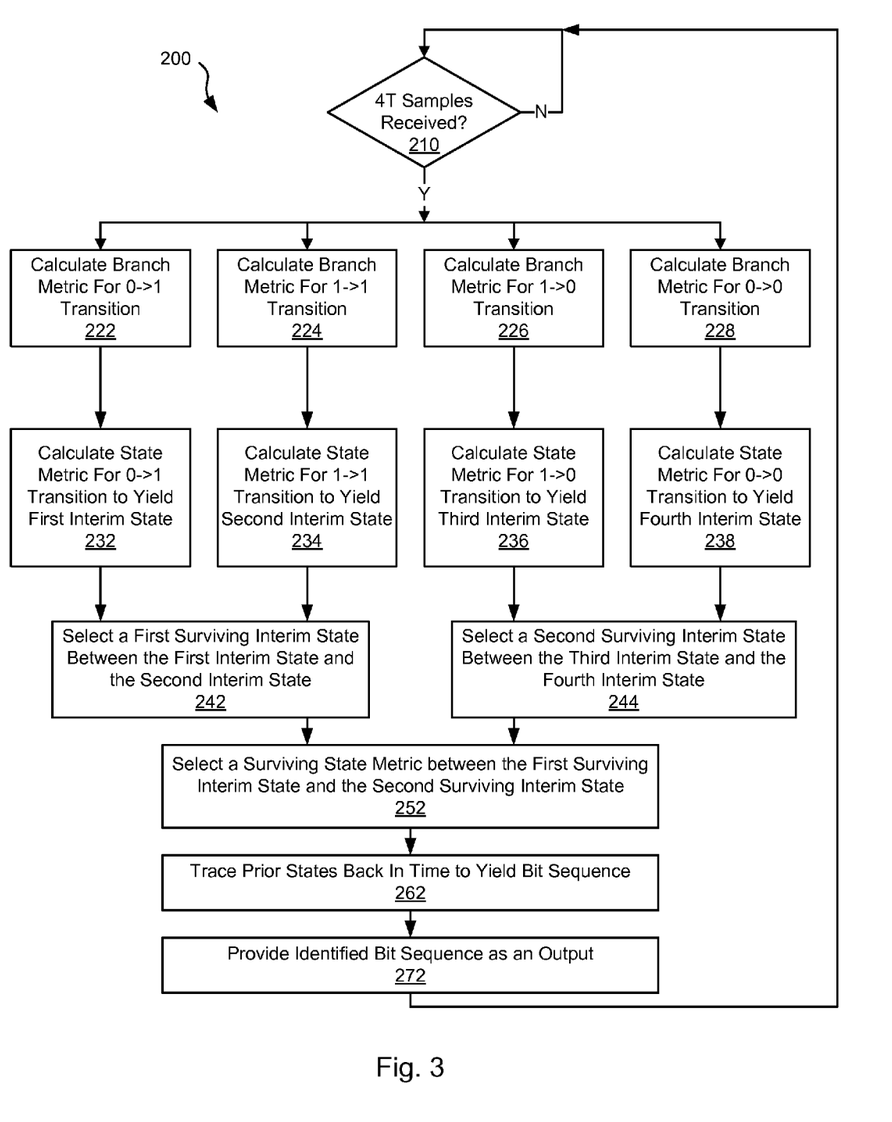
FIG. 3 is a flow diagram depicting a sequence detection process in accordance with various embodiments of the present invention.

Turing to FIG. 3, a flow diagram 200 depicts a sequence detection process in accordance with various embodiments of the present invention. Following flow diagram 200, it is determined whether 4T samples have been received (block 210). As previously described, 4T samples implies four samples for each bit transition. It should be noted that more or fewer samples per bit transition may be used in relation to different embodiments of the present invention. Once the prescribed number of samples has been received (block 210), the received samples are multiplied by respective correlator values to yield path values for the transitions from zero to zero, from zero to one, from one to zero, and from one to one. As an example, the four samples are: 51, −35, −102, −112. A prior zero state value is '12' and a prior one state value is '124'. In particular, a branch metric is calculated of a zero to one transition using a correlator value corresponding to a zero to one transition ('−1 0 1 1') (block 222). Using the aforementioned example inputs, the branch metric is calculated in accordance with the following equation:

Branch Metric=(−1*51)+(0*−35)+(1*−102)+(1*−112)=−265.

Similarly, a branch metric is calculated of a one to one transition using a correlator value corresponding to a one to one transition ('0 −1 0 1') (block 224). Using the aforementioned example inputs, the branch metric is calculated in accordance with the following equation:

Branch Metric=(0*51)+(−1*−35)+(0*−102)+(1*−112)=−77.

A branch metric is calculated of a one to zero transition using a correlator value corresponding to a one to zero transition ('1 0 −1 −1') (block 226). Using the aforementioned example inputs, the branch metric is calculated in accordance with the following equation:

Branch Metric=(1*51)+(0*−35)+(−1*−102)+(−1*−112)=265.

In addition, a branch metric is calculated of a zero to zero transition using a correlator value corresponding to a zero to zero transition ('0 1 0 −1') (block 228). Using the aforementioned example inputs, the branch metric is calculated in accordance with the following equation:

Branch Metric=(0*51)+(1*−35)+(0*−102)+(−1*−112)=77.

Once the branch metrics are available, the branch metrics are added to the value of the state from which the branch metric was derived. In particular, a state metric is calculated for the zero to one transition state to yield a first interim state (block 232). Using the aforementioned example inputs, the first interim state value is calculated in accordance with the following equation:

First Interim Value=Prior Zero State Value+0→1 Branch Metric=12−265=−253.

A state metric is calculated for the one to one transition state to yield a second interim state (block 234). Using the aforementioned example inputs, the second interim state value is calculated in accordance with the following equation:

Second Interim Value=Prior One State Value+1→1 Branch Metric=124−77=47.

A state metric is calculated for the one to zero transition state to yield a third interim state (block 236). Using the aforementioned example inputs, the fourth interim state value is calculated in accordance with the following equation:

Third Interim Value=Prior One State Value+1→0 Branch Metric=124+265=389.

In addition, a state metric is calculated for the zero to zero transition state to yield a fourth interim state (block 238). Using the aforementioned example inputs, the third interim state value is calculated in accordance with the following equation:

Fourth Interim Value=Prior Zero State Value+0→0 Branch Metric=12+77=89.

A first surviving state metric is selected between the previously calculated first interim value and the second interim value (block 242). This is done by selecting the larger of the first interim value and the second interim value which in this example is '47'. This value is stored as the prior one state metric for use in multiplying the next series of data samples (e.g., in blocks 222, 224, 226, 228). In addition, a second surviving state metric is selected between the previously calculated third interim value and the fourth interim value (block 244). This is done by selecting the larger of the third interim value and the fourth interim value which in this example is '389'. This value is stored as the prior zero state metric for use in multiplying the next series of data samples (e.g., in blocks 222, 224, 226, 228). Based on the previously determined first surviving interim state and second surviving interim state, a surviving state metric is selected (block 252). This is done by selecting the larger of the first surviving interim state and the second surviving interim state which in this example is '389'. The surviving state metric in this case is the zero state. This surviving state metric corresponds to the most recent bit in the detected sequence, and is used to trace back in time to yield the detected bit sequence over the desired number of bits (block 262). This is done by determining prior state metrics in the path that ultimately resulted in the calculation of the value of the surviving state metric. The identified bit sequence is then provided as an output (block 272), and the process is repeated for the next series of digital samples that are received (block 210).

Figure 5:
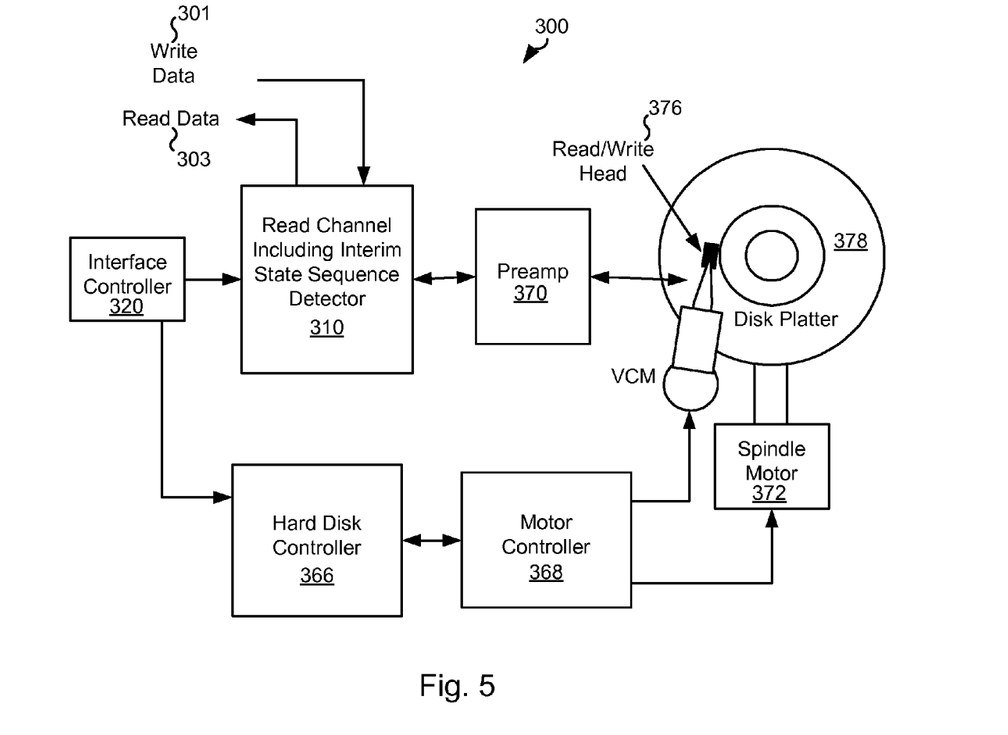
FIG. 5 shows a storage system including a read channel circuit with interim state sequence detecting in accordance with some embodiments of the present invention.

Turning to FIG. 5, a storage system 300 including a read channel circuit 310 with interim state sequence detecting is shown in accordance with various embodiments of the present invention. Storage system 300 may be, for example, a hard disk drive. The low latency loop recovery includes a data detector circuit that may be any data detector known in the art. Storage system 300 also includes a preamplifier 370, an interface controller 320, a hard disk controller 366, a motor controller 368, a spindle motor 372, a disk platter 378, and a read/write head 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 376 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel module 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. As part of decoding the received information, read channel circuit 310 performs a data sequence detection process to identify various information markers including, but not limited, a preamble in a servo data set to determine the location of read/write head assembly 376 relative to disk platter 378. Such data sequence detection may be performed using the circuit described above in relation to FIG. 2 and/or the method discussed above in relation to FIG. 3a. A write operation is substantially the opposite of the preceding read operation with write data 301 being provided to read channel circuit 310. This data is then encoded and written to disk platter 378.

In conclusion, the invention provides novel systems, devices, methods and arrangements for performing data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for data detection, the method comprising:
   receiving a series of data samples;
   multiplying a portion of the series of data samples by a first correlator value corresponding to a first binary transition to yield a first value;
   multiplying the portion of the series of data samples by a second correlator value corresponding to a second binary transition to yield a second value;
   adding the first value to a first prior state value by an adder circuit to yield a first interim value;
   adding the second value to a second prior state value to yield a second interim value;
   selecting the larger of the first interim value and the second interim value to yield a first surviving interim value;
   multiplying the portion of the series of data samples by a third correlator value corresponding to a third binary transition to yield a third value;
   multiplying the portion of the series of data samples by a fourth correlator value corresponding to a fourth binary transition to yield a fourth value;
   adding the third value to the first prior state value to yield a third interim value;
   adding the fourth value to the second prior state value to yield a fourth interim value; and
   selecting the larger of the third interim value and the fourth interim value to yield a second surviving interim value.

2. The method of claim 1, wherein the method further comprises:
   storing the surviving interim value as the prior state value.

3. The method of claim 1, wherein the method further comprises:
   storing the second surviving interim value as the second prior state value.

4. The method of claim 1, wherein the method further comprises:
   selecting the larger of the first surviving interim value and the second surviving interim value to yield a surviving state value, wherein the surviving state value is associated with a surviving state; and
   selecting the surviving state as the most recent bit in a bit sequence.

5. The method of claim 4, wherein the method further comprises:
   selecting a prior state corresponding to one of the first prior state value and the second prior state value that was used in calculating the selected one of the first surviving interim value and the second surviving interim value as the bit preceding the most recent bit in the bit sequence.

6. The method of claim 1, wherein the first prior state value corresponds to a zero state, and wherein the second prior state value corresponds to a one state.

7. The method of claim 1, wherein the third binary transition is a zero state to a one state transition; and wherein the fourth binary transition is a one state to a one state transition.

8. The method of claim 7, wherein the first binary state is a one state to a zero state transition; and wherein the second binary state is a zero state to a zero state transition.

9. The method of claim 8, wherein the first correlator value is an array 1, 0, −1, −1; wherein the second correlator value is an array 0, 1, 0, −1; wherein the third correlator value is an array −1, 0, 1, 1; and wherein the fourth correlator value is an array 0, −1, 0, 1.

10. A sequence detector circuit, the circuit comprising:
    a first multiplier circuit operable to multiply a series of digital samples by a first correlator value corresponding to a one state to a one state transition to yield a first value;
    a second multiplier circuit operable to multiply the series of digital samples by a second correlator value corresponding to a zero state to a one state transition to yield a second value;
    a third multiplier circuit operable to multiply the series of digital samples by a third correlator value corresponding to a one state to a zero state transition to yield a third value;
    a fourth multiplier circuit operable to multiply the series of digital samples by a fourth correlator value corresponding to a zero state to a zero state transition to yield a fourth value;
    a first adder circuit operable to sum the first value and a prior one state value to yield a first interim state value;
    a second adder circuit operable to sum the second value and a prior zero state value to yield a second interim state value;
    a first selector circuit operable to select the larger of the first interim state value and the second interim state value to yield a first surviving interim state value;
    a third adder circuit operable to sum the third value and the prior zero state value to yield a third interim state value;
    a fourth adder circuit operable to sum the fourth value and the prior one state value to yield a fourth interim state value; and a second selector circuit operable to select the larger of the third interim state value and the fourth interim state value to yield a second surviving interim state value.

11. The circuit of claim 10, wherein the circuit further comprises:
a prior one state memory operable to store the first surviving interim state value as the prior one state value; and
a prior zero state memory operable to store the second surviving interim state value as the prior zero state value.

12. The circuit of claim 11, wherein the circuit further comprises:
a third selector circuit, wherein the third selector circuit is operable to select the larger of the first surviving interim state value and the second surviving interim state value to yield a surviving state value; and
a state circuit, wherein the state circuit is operable to identify a state associated with the surviving state value as the most recent bit in a bit sequence.

13. The circuit of claim 12, wherein the state circuit is further operable to identify a series of one or more preceding states in a path used to calculate the surviving state value.

14. The circuit of claim 12, wherein the state circuit is further operable to identify a state corresponding to one of the prior zero state value and the prior one state value that was used in calculating the surviving state value as the bit preceding the most recent bit in the bit sequence.

15. The circuit of claim 10, wherein the first correlator value is an array 0, −1, 0, 1; wherein the second correlator value is an array −1, 0, 1, 1; wherein the third correlator value is an array 1, 0, −1, −1; and wherein the fourth correlator value is an array 0, 1, 0, −1.

16. A storage device, the storage device comprising:
a detector circuit operable to receive information maintained on a storage medium via a read/write head assembly, and wherein the detector circuit includes:
a first multiplier circuit operable to multiply a series of digital samples by a first correlator value corresponding to a one state to a one state transition to yield a first value;
a second multiplier circuit operable to multiply the series of digital samples by a second correlator value corresponding to a zero state to a one state transition to yield a second value;
a third multiplier circuit operable to multiply the series of digital samples by a third correlator value corresponding to a one state to a zero state transition to yield a third value;
a fourth multiplier circuit operable to multiply the series of digital samples by a fourth correlator value corresponding to a zero state to a zero state transition to yield a fourth value;
a first adder circuit operable to sum the first value and a prior one state value to yield a first interim state value;
a second adder circuit operable to sum the second value and a prior zero state value to yield a second interim state value;
a first selector circuit operable to select the larger of the first interim state value and the second interim state value to yield a first surviving interim state value;
a third adder circuit operable to sum the third value and the prior zero state value to yield a third interim state value;
a fourth adder circuit operable to sum the fourth value and the prior one state value to yield a fourth interim state value; and
a second selector circuit operable to select the larger of the third interim state value and the fourth interim state value to yield a second surviving interim state value.

17. The storage device of claim 16, wherein the storage device further comprises:
a prior one state memory operable to store the first surviving interim state value as the prior one state value; and
a prior zero state memory operable to store the second surviving interim state value as the prior zero state value.

18. The storage device of claim 17, wherein the storage device further comprises:
a third selector circuit, wherein the third selector circuit is operable to select the larger of the first surviving interim state value and the second surviving interim state value to yield a surviving state value; and
a state circuit, wherein the state circuit is operable to identify a state associated with the surviving state value as the most recent bit in a bit sequence.

19. The storage device of claim 18, wherein the state circuit is further operable to identify a state corresponding to one of the prior zero state value and the prior one state value that was used in calculating the surviving state value as the bit preceding the most recent bit in the bit sequence.

* * * * *